United States Patent
Nugues et al.

(10) Patent No.: US 9,558,913 B2
(45) Date of Patent: Jan. 31, 2017

(54) SYSTEM FOR DETECTING AND COUNTING IONS

(71) Applicant: THALES, Neuilly-sur-Seine (FR)

(72) Inventors: Pierre Nugues, Velizy-Villacoublay (FR); Adel Douahi, Velizy-Villacoublay (FR); Rene-Paul Garcia, Jouars-Pontchartrain (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 14/365,586

(22) PCT Filed: Dec. 11, 2012

(86) PCT No.: PCT/EP2012/075102
§ 371 (c)(1),
(2) Date: Jun. 13, 2014

(87) PCT Pub. No.: WO2013/087635
PCT Pub. Date: Jun. 20, 2013

(65) Prior Publication Data
US 2014/0339435 A1    Nov. 20, 2014

(30) Foreign Application Priority Data

Dec. 15, 2011 (FR) ..................... 11 03864

(51) Int. Cl.
*H01J 37/244* (2006.01)
*H01J 49/02* (2006.01)
*G04F 5/14* (2006.01)

(52) U.S. Cl.
CPC ............. *H01J 37/244* (2013.01); *G04F 5/14* (2013.01); *H01J 49/025* (2013.01)

(58) Field of Classification Search
CPC . H01J 2237/31701; H01J 37/08; H01J 37/244
USPC ........................................... 250/393
See application file for complete search history.

(56) References Cited

U.S. PATENT DOCUMENTS

| | | | |
|---|---|---|---|
| 4,151,414 A | 4/1979 | Fite et al. | |
| 4,246,481 A | 1/1981 | Liebl | |
| 4,742,232 A * | 5/1988 | Biddle et al. | 250/427 |
| 4,792,687 A * | 12/1988 | Mobley | 250/423 R |
| 5,014,009 A | 5/1991 | Arimoto et al. | |
| 5,497,006 A * | 3/1996 | Sferlazzo et al. | 250/427 |
| 2007/0187592 A1* | 8/2007 | Geist et al. | 250/298 |

FOREIGN PATENT DOCUMENTS

| | | |
|---|---|---|
| FR | 2417180 A1 | 9/1979 |
| JP | 11345590 A | 12/1999 |

OTHER PUBLICATIONS

Sinha et al., "Particle Analysis by Mass Spectrometry", Journal of Colloid an Interface Science, Academic Press, May 1982, vol. 87, No. 1, pp. 140-153.

(Continued)

*Primary Examiner* — Marcus Taningco
(74) *Attorney, Agent, or Firm* — Baker Hostetler LLP

(57) ABSTRACT

A system for detecting and counting ions comprises a source of atoms, a hot filament ion source, means for generating an electric field and a magnetic field, and means for detecting and counting the ions, and the filament comprises a portion that is concave along its longitudinal and/or transverse axis.

10 Claims, 1 Drawing Sheet

(56) References Cited

OTHER PUBLICATIONS

Christandl et al., "Two-Dimensional Imaging of Neutral Alkali Atom Samples Using Surface Ionization", Review of Scientific Instruments, Dec. 2002, vol. 73, No. 12, pp. 4201-4205.
R. Delhuille, et al., "Optimization of a Langmuir-Taylor Detector for Lithium", Review of Scientific Instruments, Jun. 1, 2002, pp. 2249-2258, vol. 73, No. 6, AIP, Melville, NY, USA, XP012040045.

* cited by examiner

SYSTEM FOR DETECTING AND COUNTING IONS

CROSS-REFERENCE TO RELATED APPLICATIONS

This application is a National Stage of International patent application PCT/EP2012/075102, filed on Dec. 11, 2012, which claims priority to foreign French patent application No. FR 1103864, filed on Dec. 15, 2011, the disclosures of which are incorporated by reference in their entirety.

FIELD OF THE INVENTION

The invention relates to a system for detecting and counting ions. This type of system is widely used to detect and count ions in mass spectrometers or atomic clocks.

BACKGROUND

It is known to use a hot filament ion source in a system for detecting and counting ions. Atoms, originating from a source of atoms, present near the hot filament are ionized and the ions formed are reemitted. The reemitted ions form a beam that is focused in the direction of ion detecting and counting modules using ion extracting electrodes and a magnetic field.

The document "Optimisation of a Langmuir-Taylor detector for lithium" by R. Delhuille et al. (Rev. Sci. Instrum. 73, 2249 (2002)) describes a system for detecting and counting ions comprising a source of atoms, a hot filament ion source, ion extracting electrodes and ion detecting and counting modules. The filament of the ion source takes the form of a substantially flat strip, in other words the filament is a straight flat strip.

The operating principle of this system for detecting and counting ions may be summarized as follows: a source of atoms emits a gas composed of atoms. The atoms of the gas strike the hot filament, said filament has a work function higher than the ionization energy of the atoms. One or more judiciously placed extracting electrodes, possibly encircling the filament, facilitate the reemission of the ions, the trajectory of the latter being oriented toward the source of atoms. A magnetic field then deviates the trajectory of the ions toward the detecting and counting modules.

One drawback of the aforementioned system, such as described in the document, resides in the fact that only a certain percentage, typically 50%, of the ions emitted by the hot filament is focused on the ion detecting and counting modules, thereby leading to a substantial loss of said ions at the detecting modules.

SUMMARY OF THE INVENTION

One aim of the invention is to provide a system for detecting and counting ions, which makes improved detection and improved counting of the ions reemitted by the hot filament ion source possible.

According to one aspect of the invention, a system is provided for detecting and counting ions, comprising a source of atoms, a hot filament ion source, means for generating a magnetic field, and means for detecting and counting said ions, characterized in that said filament comprises a portion that is concave along its longitudinal and/or transverse axis. The radius of curvature is continuous along the longitudinal and/or transverse axis.

Thus, the trajectory of the ion beam reemitted by the filament is already focused on the detecting and counting means. Thus, since the ion beam is focused on these means, it is possible to use a lower electric field strength. In addition, improving the focus of the reemitted ion beam on the detecting and counting means allows the performance of the devices, such as atomic clocks or mass spectrometers, that use such means to be improved.

BRIEF DESCRIPTION OF THE DRAWINGS

The invention will be better understood on studying a few embodiments given by way of completely nonlimiting examples and illustrated by the appended drawings, in which.

DETAILED DESCRIPTION

Figure 1:
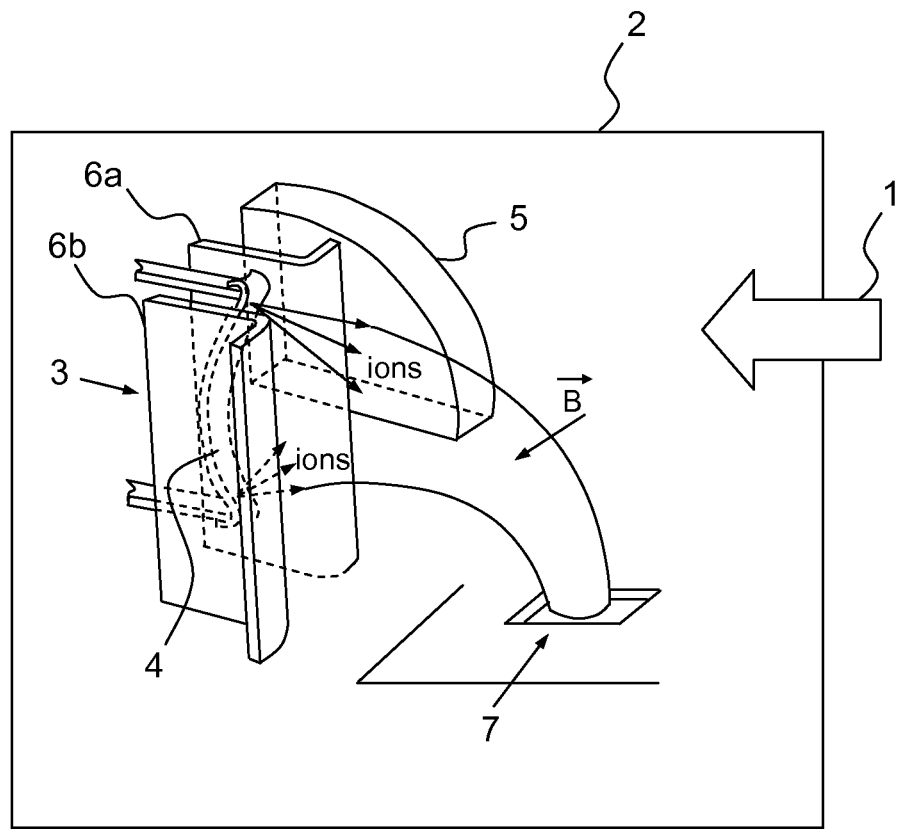
FIG. 1 shows a system for detecting and counting ions, according to one aspect of the invention.

FIG. 1 shows a source 1 of atoms, a vacuum chamber 2 containing a hot filament 4 ion source 3 a portion of the filament 4 of which is concave, means 5 for generating a magnetic field, one or more ion extracting electrodes 6a, 6b that generate an electric field and ion detecting and counting means 7.

The source of atoms 1 comprises a chamber containing a gaseous atmosphere made up of atoms to be ionized, conventionally cesium atoms. Said atoms are drawn into the vacuum chamber 2 by the pressure difference between the vacuum chamber 2 and the source of atoms 1. Atoms present near the hot filament 4 are ionized. The ions thus formed are torn, along ionic trajectories, from the filament using an accelerating potential difference generated by one or more extracting electrodes 6a, 6b that encircle the filament 4 in the example shown in FIG. 1. The trajectory of the emitted ion beam is already focused because of the curvature of the filament 4. The ion beam is then subjected to a transverse magnetic field perpendicular to the trajectories of the ions and parallel to the plane of the detector, in order to filter the ions depending on their nature and to curve the ion beam toward the ion detecting and counting means 7. The magnetic field is created by magnetic field generating means 5 that are located on either side of the extracting electrodes 6a, 6b. For the sake of clarity, only one of the two magnetic field generating means has been shown in FIG. 1.

The filament 4 of the ion source 3 comprises a refractory material the melting point $T_f$ of which is higher than 1600° C. in order to withstand the large temperature increase. In addition, the filament 4 comprises a material the value of the work function of which is higher than the ionization energy of cesium, namely 1.8 eV. Preferably, the material of the filament 4 comprises at least one of the following elements: niobium, iridium, platinum, molybdenum, tantalum, tungsten or rhenium.

The filament 4 has a parallelepipedal geometry and takes the form of a flat strip. In order to ionize the maximum of incident atoms, the length $L_f$ and the width $l_f$ of the filament 4 depend on the length $L_s$ and the width $l_s$ of the source 1 of atoms. The filament 4 must be sufficiently thick to withstand mechanically the large increase in temperature of the filament 4, while remaining sufficiently resistive. Preferably, the filament is comprised between 10 and 100 μm in thickness.

For example, the filament 4 has a concave portion along its longitudinal and/or transverse axis. The radius of curvature of said filament depends on the applied electric field and the applied magnetic field, on the distance to be travelled by the reemitted ions and on the diameter of the orifice of the ion detecting and counting means 7; preferably, the radius of curvature is located in a range comprised between 15 and 50 mm. In this way, using a longitudinal radius of curvature of 25 mm equal to the transverse radius of curvature, and an accelerating voltage of 12 V, the detected ionic current has been increased by 20 to 30%.

Figure 2:
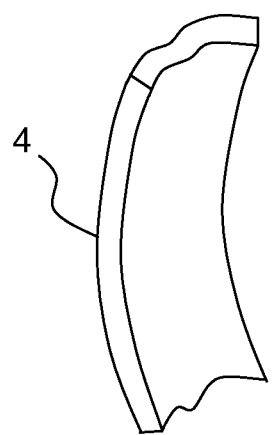
FIG. 2 illustrates a portion of the filament in FIG. 1, according to one aspect of the invention.

As a variant, the transverse radius of curvature r of said filament 4 may depend on the longitudinal radius of curvature R of said filament 4, as illustrated in FIG. 2 which shows a detail of the filament 4 in FIG. 1. The curvature along the transverse axis of the filament plays a role in improving the focus of thermal ions—thermal ions are thermally excited ions, their velocity vector, when they are reemitted from the filament, is not normal to the emission surface of the filament 4. In addition, the transverse curvature improves the mechanical strength of the filament when the latter is heated. The radius of curvature along the transverse axis r of the filament of the ion source 3 is advantageously comprised between 0.5 R and 1.5 R.

According to another variant of the invention, the radius of curvature along the transverse axis r of the filament of the ion source 3 may be identical to the radius of curvature along the longitudinal axis R of the filament of the ion source 3.

The detecting and counting system according to the invention allows reemitted ions to be better focused on the ion detecting and counting means, thereby allowing the performance of devices that use them to be improved.

The invention claimed is:

1. A system for detecting and counting ions, comprising a source of atoms, a hot filament ion source, means for generating a magnetic field, and means for detecting and counting said ions, wherein said filament comprises a portion that is concave along its longitudinal axis and transverse axis.

2. The system as claimed in claim 1, wherein the radius of curvature of said filament depends on the distance to be travelled by the ions, on the magnitude of the applied electric field and the applied magnetic field and on the area of the orifice of the detector.

3. The system as claimed in claim 1, wherein the radius of curvature of said filament is comprised between 15 and 50 mm.

4. The system as claimed in claim 1, wherein the transverse radius of curvature (r) of said filament depends on the longitudinal radius of curvature (R) of said filament according to the relationship $0.5R<r<1.5R$.

5. The system as claimed in claim 1, wherein the transverse radius of curvature (r) of said filament is equal to the longitudinal radius of curvature (R) of said filament.

6. The system as claimed in claim 1, wherein said filament is a flat strip.

7. The system as claimed in claim 1, wherein the length ($L_f$) and the width ($I_f$) of said filament depend on the length ($L_s$) and the width ($I_s$) of the beam of atoms emitted by the source of atoms.

8. The system as claimed in claim 1, wherein said filament is larger than 10 µm in thickness.

9. The system as claimed in claim 1, wherein said filament comprises a refractory material, the melting point of which is above 1600° C.

10. The system as claimed in claim 1, wherein said filament comprises a material the value of the work function of which is higher than the ionization potential of the atoms to be ionized.

* * * * *